United States Patent [19]

Santangelo et al.

[11] Patent Number: 5,342,793
[45] Date of Patent: Aug. 30, 1994

[54] PROCESS FOR OBTAINING MULTI-LAYER METALLIZATION OF THE BACK OF A SEMICONDUCTOR SUBSTRATE

[75] Inventors: Antonello Santangelo, Belpasso CT; Carmelo Margo, Catania CT; Paolo Lanza, Cassaro SR, all of Italy

[73] Assignee: SGS-Thomson Microelectronics, S.R.L., Agrate Brianza MI, Italy

[21] Appl. No.: 88,113

[22] Filed: Jul. 9, 1993

Related U.S. Application Data

[63] Continuation-in-part of Ser. No. 651,621, Feb. 7, 1991, abandoned.

[30] Foreign Application Priority Data

Feb. 20, 1990 [EP] European Pat. Off. ......... 90830062.7

[51] Int. Cl.⁵ .................................... H01L 21/283
[52] U.S. Cl. ........................... 437/25; 437/192; 437/245; 437/247
[58] Field of Search ............... 437/245, 25, 187, 188, 437/189, 192, 196, 245, 247

[56] References Cited

U.S. PATENT DOCUMENTS 3,934,331  1/1976  Sugiyama ............................ 437/187
4,517,226  5/1985  Baldi et al. .
4,914,054  4/1990  Moriyama et al. .................. 437/196

FOREIGN PATENT DOCUMENTS 1120607      3/1982  Canada .
0012324A1    6/1980  European Pat. Off. .
2531106A1    2/1984  France .
57-15420     1/1982  Japan .................................. 437/189
58-106825    6/1983  Japan .................................. 437/188

OTHER PUBLICATIONS

Ishibashi et al., "Study on Formation of Solid-Phase-Epitaxial CoSi$_2$ Films and Pattering Effects", Extended Abstracts of the 15th Conference on Solid State Devices and Materials, Tokyo, 1983, pp. 11–14, 2419 Japanese Journal of Applied Physics Supplements.

Palladium Silicide Contact Resistance Stabilization By Ion Implantation; W. Rausch et al; IBM Technical Disclosure Bulletin; vol. 24 No. 7A Dec. 1981; IBM Corp. 1981, p. 3453.

Primary Examiner—R. Bruce Breneman
Assistant Examiner—Ourmazd S. Ojan
Attorney, Agent, or Firm—Wenderoth, Lind & Ponack

[57] ABSTRACT

The metallization of the back of the semiconductor substrate is obtained by depositing a series of metal layers, after ion implantation of dopant on the interface with the first layer. The step of ion implantation is followed by the deposition of one or more metal layers of the aforesaid series, and then by thermal annealing under vacuum or in an inert atmosphere, at a temperature considerably lower than 500° C. and for a period considerably shorter than 60 minutes.

12 Claims, 1 Drawing Sheet

PROCESS FOR OBTAINING MULTI-LAYER METALLIZATION OF THE BACK OF A SEMICONDUCTOR SUBSTRATE

This application is a continuation-in-part of now abandoned application, Ser. No. 07/651,621, filed on Feb. 7, 1991, now abandoned.

BACKGROUND OF THE INVENTION

This invention relates to a process for obtaining a multilayer metallization of the back of a semiconductor substrate.

Numerous semiconductor electron devices use the back of the substrate, on which they are constructed, as an electrical terminal. This area must therefore be metallized in order to enable the electrical connection and the M-S (Metal Semiconductor) contact must have a sufficiently low specific contact resistance as to ensure that no appreciable voltage drops occur when the current passes through (i.e.- an ohmic contact).

In the majority of cases, the metallization on the back must also ensure the possibility of welding the latter onto a metal support which forms part of the package of the finished device and also acts as a heatsink. In order to simultaneously guarantee these characteristics, very often several layers of metal are deposited on the back, with the first layer of metal having a low barrier height for the underlying semiconductor. Moreover, since one of the main factors on which the specific contact resistance of an M-S junction depends, consists of the concentration of electrically active dopant present in correspondence with the M-S interface, very often the surface of the semiconductor is enriched with dopant before the layers of metal are applied.

The most widely used methods of enrichment consist of predeposition and ion implantation of the dopant. The first method calls for very high temperatures (of over 900° C.).

With a second method, if the ion bombardment has produced a surface layer of amorphous material, it is necessary to carry out the subsequent annealing at a temperature higher than 500°-550° C. in the case of silicon, with a subsequent epitaxial regrowth in the solid phase ("SPE") of the damaged layer and activation of the implanted species. Whereas, if the ion bombardment has not caused amorphization, it is necessary to use a higher annealing temperature to activate the implanted species.

With both the first and the second method, the temperature at which the thermal processes are carried out proves to be harmful for the devices on the front of the wafer.

On the other hand, since it is necessary, upon completion of the front of the wafer, to reduce the thickness of the substrate by means of an appropriate finishing process, the rear surface can only be enriched after completion of the devices present on the front. It is clear therefore that the known techniques for enriching the surface of the semiconductor are of little help in solving this problem.

SUMMARY OF THE INVENTION

The main scope of this invention is to provide a process for multilayer metallization of the back of a semiconductor substrate which offers a satisfactory M-S ohmic contact and in particular to increase the concentration of dopant present on the surface of the semiconductor and at the same time keep the temperature and duration of the annealing treatment within values which rule out the possibility of alteration of other structural and functional characteristics of the semiconductor device. The process according to the invention concerns a metallization process of the back of a semiconductor substrate, obtained by depositing a sequence of metal layers after ion implantation of dopant on the surface of the semiconductor which acts as an interface with the first layer of metal, and is characterized by the fact that the step of ion implantation of dopant is carried out in such a way as to amorphize the surface of the semiconductor substrate, and is followed by the deposition of one or more layers of metal of the aforesaid sequence, and then by thermal annealing under a vacuum or in an inert atmosphere, at a temperature considerably lower than 500° C. and for a period considerably shorter than 60 minutes.

BRIEF DESCRIPTION OF THE DRAWINGS

The features of the invention will be more clearly evident from the following description of a number of nonrestrictive exemplificative embodiments, with reference to the accompanying drawings, in which FIGS. 1a)-1d), 2a)-2d) and 3a)-3c) respectively show a first, a second and a third embodiment of the process according to the invention.

DESCRIPTION OF THE PREFERRED EMBODIMENTS

The summary of the entire process according to this invention is as follows:

1) Ion implantation of the rear surface of the wafers, so as to amorphize the surface of the semiconductor. The process is carried out before depositing the sequence of metal layers. The implanted species, when activated, must have an electrical behavior homologous to that of the pre-existing dopant. The dose must be such as to ensure a satisfactory M-S ohmic contact at the end of the metallizing process. With N type silicon, good results are obtained by implanting arsenic at energies E lower than 10 KeV, so as to localize the implanted species as close as possible to the M-S interface (with $E=5$ KeV and doses equal to $2\cdot 10^{14}$ atoms/cm$^2$ the maximum concentration of the implanted specied is obtained at a distance of approximately $0,5\cdot 10^{-2}$ $\mu$m from the surface). This also reduces the thickness of the amorphized layer produced and, consequently, the annealing time.

2) Deposition on the back of the substrate of one or more layers of metal in a system suitable for sequential deposition of several layers of metal and capable of heating the substrates under vacuum or in an inert atmosphere.

Since at the end of the entire metallizing process the surface of the semiconductor will have been enriched with the appropriate species of dopant, the first layer of metal can be chosen on the basis of criteria which need not necessarily be electrical. These criteria may be better adhesion between the first layer and the semiconductor, or a better thermal expansion coefficient and less induced stress, or productivity, etc.

3) Annealing under vacuum or in an inert atmosphere, carried out in the same deposition system at a temperature considerably lower than 500° C. and for a period considerably shorter than 60 minutes (for example, $\leq$400° C. and 30 minutes respectively). In the case of silicon in particular, if the energy of the previously mentioned system is around 5 KeV, approximately 30 minutes of annealing at a temperature of approximately 375° C. are sufficient for regrowth of the amorphized layer and activation of the implanted species. The heating can be achieved, for example, by means of special lamps powered by means of a thermostatically-controlled system.

4) Sequential deposition of the remaining metal films. The last layers are very often necessary in order to ensure the possibility of welding the finished device onto a metal support by means of suitable low-melting metal alloys. Said support can form part of the final package of the device or be an electrode of a hybrid circuit. The remaining metal films can be deposited in sequence on the first metal layers and, consequently, before the annealing, which can therefore become the last step of the process. For some sequences of metals, depositing several metal layers in the series, or even the entire series, before annealing improves the adhesion between the various films.

Figure 1A:
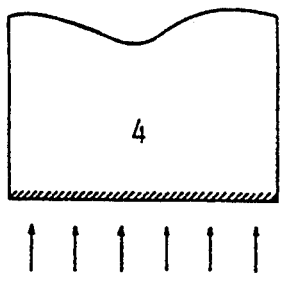
Figure 2A:
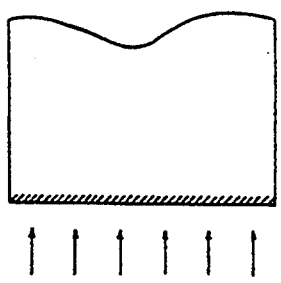
Figure 3A:
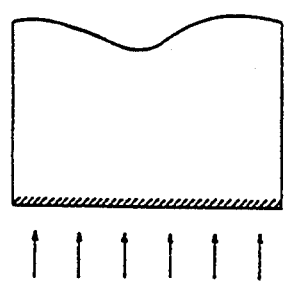
Figure 1B:
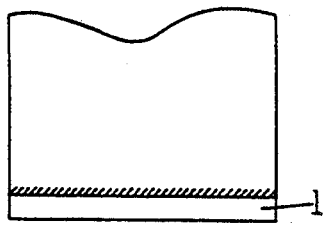
Figure 2B:
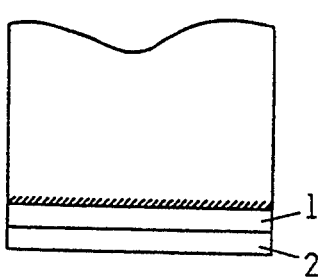
Figure 3B:
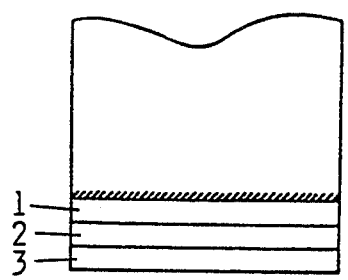
Figure 1C:
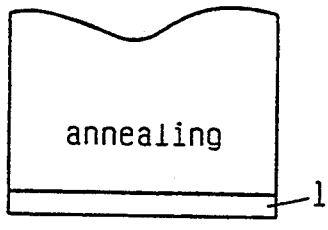
Figure 2C:
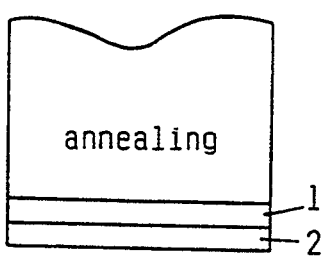
Figure 2C:
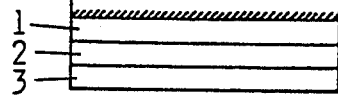
Figure 1D:
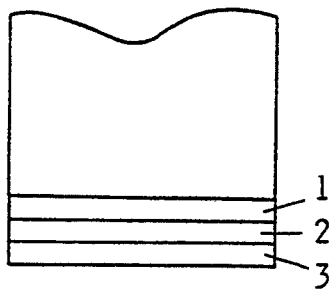
Figure 2D:
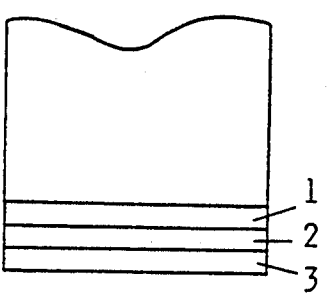
Figure 3C:
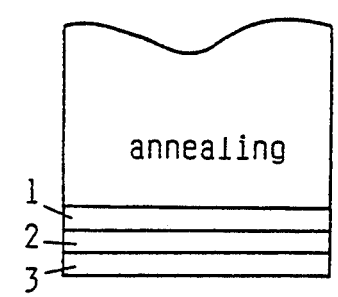

A non-restrictive example is given in the following description of a process for metallizing a $<100>$ N type silicon substrate 4 doped with approximately $2 \cdot 10^{18}$ atoms of antimony/cm$^3$ (see FIGS. 1a)–1d). First, an arsenic implantation is carried out using a dose of approximately $10^{14}$ atoms/cm$^3$ and an energy of approximately 5 KeV as shown in FIG. 1a), so as to produce an amorphized layer on the surface (layer indicated in the figure by the broken line). The substrate is then placed in an e-gun type evaporator equipped with at least three interchangeable crucibles and provided with a thermoregulated lamp heating system. After pumping to create a vacuum (with a pressure of $\leq 10^{-6}$ Torr), a first layer 1 of approximately 100 nm of titanium is deposited as shown in FIG. 1b). This is followed by a heating cycle (still under high vacuum) at 375° C. for approximately thirty minutes as shown in FIG. 1c). When the temperature has dropped slightly a further layer of approximately 350 nm of nickel and a film 3 of approximately 30 nm of gold are deposited as shown in FIG. 1d). The entire process ensures good metallurgical characteristics and specific contact resistance values lower than approximately $10^{-4}$ ohm·cm$^2$ (without the process according to this invention, there is very little likelihood of the specific contact resistance dropping below approximately $2 \cdot 10^{-2}$ ohm·cm$^2$). The annealing step, which in the process of FIGS. 1a)–1d) takes place after deposition of the first metal layer, can be carried out after the second layer has been deposited as shown in FIGS. 2a)–2d) or even after all the layers have been deposited as shown in FIGS. 3a)–3c).

In the process according to the present invention, the thermal annealing may be carried out in a high vacuum atmosphere with a pressure which is less than or equal to $10^{-6}$ Torr, and at a temperature which is less than or equal to 400° C. and for a period which is less than or equal to 30 minutes.

Furthermore, in the process according to the present invention, the thermal annealing may be carried out in an atmosphere consisting of an inert gas at a pressure which is less than or equal to $30 \cdot 10^{-3}$ Torr, at a temperature which is less than or equal to 400° C. and for a period which is less than or equal to 30 minutes.

Furthermore, in the process according to the present invention, the substrate may consist of N type silicon, and the implanted dopant may be arsenic, and the implantation energy may be less than or equal to 10 KeV.

Lastly, in the aforementioned process according to the present invention, the dosage of implanted arsenic may be approximately $2 \cdot 10^{14}$ atoms/cm$^2$, and the implantation energy may be approximately 5 KeV and the thermal annealing may be carried out at a temperature of approximately 375° C. for a period of approximately 30 minutes.

One possible explanation for the main advantage achieved with the process according to the invention is that, in addition to producing the metal electrode of the M-S contact, the deposition of the first metal film carried out after the implantation and before the annealing treatment, also has the important function of accelerating and greatly facilitating the regrowth of the previously amorphized crystal, when the system is heated during the annealing, which can consequently be carried out at considerably low temperatures and for limited periods of time.

It is inherent from the above noted description that the first metal layer deposited on the substrate must be of a metal which does not form an alloy in the liquid state with the semiconductor at a temperature below the annealing temperature, (that is—below 500° C.).

In addition to the previously mentioned main advantages, the following further advantages are also achieved:

The possibility of carrying out the annealing in the same system in which the metal layers are deposited, in addition to reducing the times and cost of the necessary equipment, improves the physical properties and reliability of the metal on the back of the substrate.

Carrying out the annealing under high vacuum conditions or in an inert atmosphere prevents oxidation or contamination of the last metal layer already deposited, thus making it possible to obtain a better interface with the metal layer deposited after the annealing;

The possibility of considerably reducing the specific M-S contact resistance makes it possible not only to improve the electrical characteristics of the semiconductor device, but also their reproducibility; moreover, the choice of the first layer of metal is less restricted by problems of specific contact resistance thus offering the possibility of satisfying other requirements (satisfactory adhesion between the first layer and the substrate, reduction of induced stress, process economy, etc.).

We claim:

1. Process for metallizing the back of a semiconductor substrate, by depositing a series of metal layers, after ion implantation of dopant on the surface of the semiconductor which acts as an interface with the first layer of metal, characterized by the fact that the step of ion implantation of dopant is carried out in such a way as to amorphize the surface of the semiconductor substrate, and is followed by the deposition of one or more layers of metal of the aforesaid series, and then by thermal annealing under vacuum or in an inert atmosphere, at a temperature considerably lower than 500° C. and for a period considerably shorter than 60 minutes; wherein the first of said series of metal layers comprises titanium.

2. Process as claimed in claim 1, characterized by the fact that the deposition of the metal layers and the thermal annealing are carried out in the same equipment suitable for sequential deposition of several layers of metal on a semiconductor substrate and for heating the same substrate under vacuum or in an inert atmosphere.

3. Process as claimed in claim 1, characterized by the fact that the thermal annealing is carried out in a high-vacuum atmosphere with a pressure which is less than or equal to $10^{-6}$ Torr, at a temperature which is less than or equal 400° C. and for a period which is less than or equal 30 minutes.

4. Process as claimed in claim 1, characterized by the fact that the thermal annealing is carried out in an atmosphere consisting of inert gas at a pressure which is less than or equal to $30 \cdot 10^{-3}$ Torr, at a temperature which is less than or equal to 30 minutes.

5. Process as claimed in claim 1, characterized by the fact that the fact that the substrate consists of N type silicon, the implanted dopant is arsenic, and the implantation energy is less than or equal to 10 KeV.

6. Process as claimed in claim 5, characterized by the fact that the dose of arsenic implanted is approximately $2 \cdot 10^{14}$ atoms/cm$^2$, the implantation energy is approximately 5 KeV, and the thermal annealing is carried out at a temperature of approximately 375° C. for a period of approximately 30 minutes.

7. Process for metallizing the back of a semiconductor substrate, by depositing a series of metal layers, after ion implantation of dopant on the surface of the semiconductor which acts as an interface with the first layer of metal, characterized by the fact that the step of ion implantation of dopant is carried out in such a way as to amorphize the surface of the semiconductor substrate, and is followed by the deposition of one or more layers of metal of the aforesaid series, and then by thermal annealing under vacuum or in an inert atmosphere, at a temperature considerably lower than 500° C. and for a period considerably shorter than 60 minutes; wherein the first of said series of metal layers comprises a metal which fails to form an alloy in the liquid state with the semiconductor at temperatures below 500° C.

8. Process as claimed in claim 7, characterized by the fact that the deposition of the metal layers and the thermal annealing are carried out in the same equipment suitable for sequential deposition of several layers of metal on a semiconductor substrate and for heating the same substrate under vacuum or in an inert atmosphere.

9. Process as claimed in claim 7, characterized by the fact that the thermal annealing is carried out in a high-vacuum atmosphere with a pressure which is less than or equal to $10^{-6}$ Torr, at a temperature which is less than or equal to 400° C. and for a period which is less than or equal to 30 minutes.

10. Process as claimed in claim 7, characterized by the fact that the thermal annealing is carried out in an atmosphere consisting of inert gas at a pressure which is less than or equal to $30 \cdot 10^{-3}$ Torr, at a temperature which is less than or equal to 400° C. and for a period which is less than or equal to 30 minutes.

11. Process as claimed in claim 7, characterized by the fact that the fact that the substrate consists of N type silicon, the implanted dopant is arsenic, and the implantation energy is less than or equal to 10 KeV.

12. Process as claimed in claim 11, characterized by the fact that the dose of arsenic implanted is approximately $2 \cdot 10^{14}$ atoms/cm$^2$, the implantation energy is approximately 5 KeV, and the thermal annealing is carried out at a temperature of approximately 375° C. for a period of approximately 30 minutes.

* * * * *